(12) United States Patent
Kunz et al.

(10) Patent No.: US 6,804,095 B2
(45) Date of Patent: Oct. 12, 2004

(54) DRAIN-EXTENDED MOS ESD PROTECTION STRUCTURE

(75) Inventors: Keith E. Kunz, Dallas, TX (US); Charvaka Duvvury, Plano, TX (US); Dan M. Mosher, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/618,893

(22) Filed: Jul. 14, 2003

(65) Prior Publication Data

US 2004/0027745 A1 Feb. 12, 2004

Related U.S. Application Data

(62) Division of application No. 10/163,712, filed on Jun. 5, 2002, now Pat. No. 6,624,487.

(51) Int. Cl.$^7$ ................................................ H02H 9/00
(52) U.S. Cl. ........................ 361/56; 361/91.1; 361/111; 361/118
(58) Field of Search .............................. 361/56, 58, 111, 361/113, 118, 127, 91.1

(56) References Cited

U.S. PATENT DOCUMENTS

| | | |
|---|---|---|
| 4,692,781 A | 9/1987 | Rountree et al. |
| 4,855,620 A | 8/1989 | Duvvury et al. |
| 5,012,317 A | 4/1991 | Rountree |
| 5,907,462 A | 5/1999 | Chatterjee et al. |
| 5,940,258 A | 8/1999 | Duvvury ..................... 257/409 |
| 6,624,487 B1 * | 9/2003 | Kunz et al. ................. 257/409 |

OTHER PUBLICATIONS

Rountree et al., "A Process–Tolerant Input Protection Circuit for Advanced CMOS Processes," 1988 EOS/ESD Symposium, pp. 201–205.

Duvvury et al., "Substrate Pump NMOS for ESD Protection Applications," 2000 EOS/ESD Symposium, Paper 1A.2.1, pp. 7–17.

Kunz et al., "5–V Tolerant Fail–safe ESD Solutions for 0.18 um Logic CMOS Process," 2001 ESD/EOS Symposium, Sep. 11, 2001.

* cited by examiner

Primary Examiner—Stephen W. Jackson
(74) Attorney, Agent, or Firm—Peter K. McLarty; W. James Brady, III; Frederick J. Telecky, Jr.

(57) ABSTRACT

A protection structure (30; 30'; 30") for safely conducting charge from electrostatic discharge (ESD) at a terminal (IN) is disclosed. The protection structure (30; 30'; 30") includes a pair of drain-extended metal-oxide-semiconductor (MOS) transistors (32, 34). In a pump transistors (32), the gate electrode (45) overlaps a portion of a well (42) in which the drain (44) is disposed, to provide a significant gate-to-drain capacitance. The drains of the transistors (32, 34) are connected together and to the terminal (IN), while the gates of the transistors (32, 34) are connected together. The source of one transistor (32) is connected to a guard ring (50), of the same conductivity type as the substrate (40) within which the channel region of the other transistors (34) is disposed. An ESD event received at the terminal (IN) is thus coupled to the gate of the transistors (32, 34), causing conduction to the substrate (40) via the guard ring (50), and turning on a parasitic bipolar transistor at the other transistor (34), safely conducting the ESD current. One alternative structure (30') includes a junction capacitor (65) coupled between the terminal (IN) and the gates of the transistors (32, 34) to improve the coupling. Another alternative structure (30") includes a clamping diode (92) that also presents a parasitic bipolar transistor (95) enhancing the current conducted to the substrate (40).

3 Claims, 7 Drawing Sheets

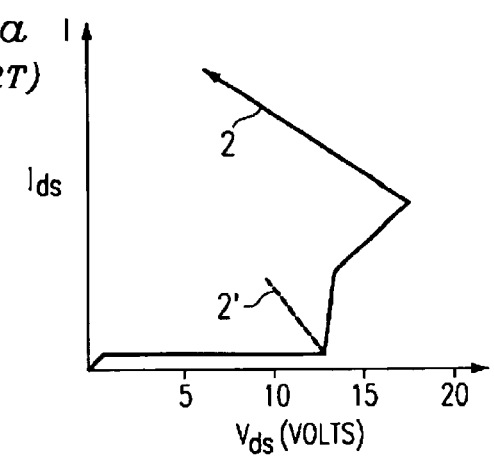
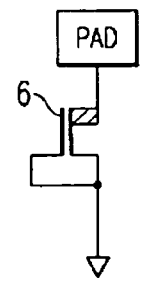
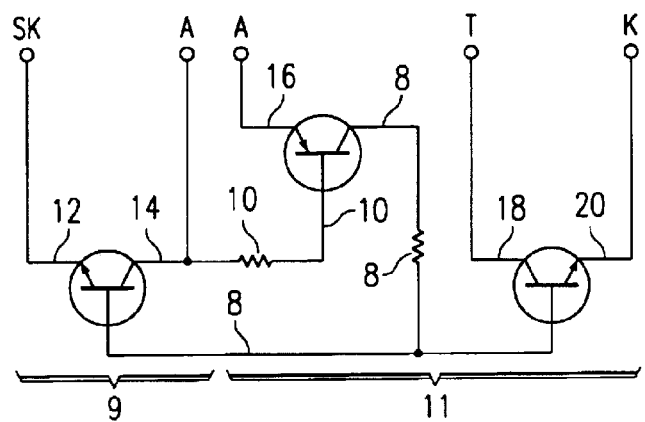
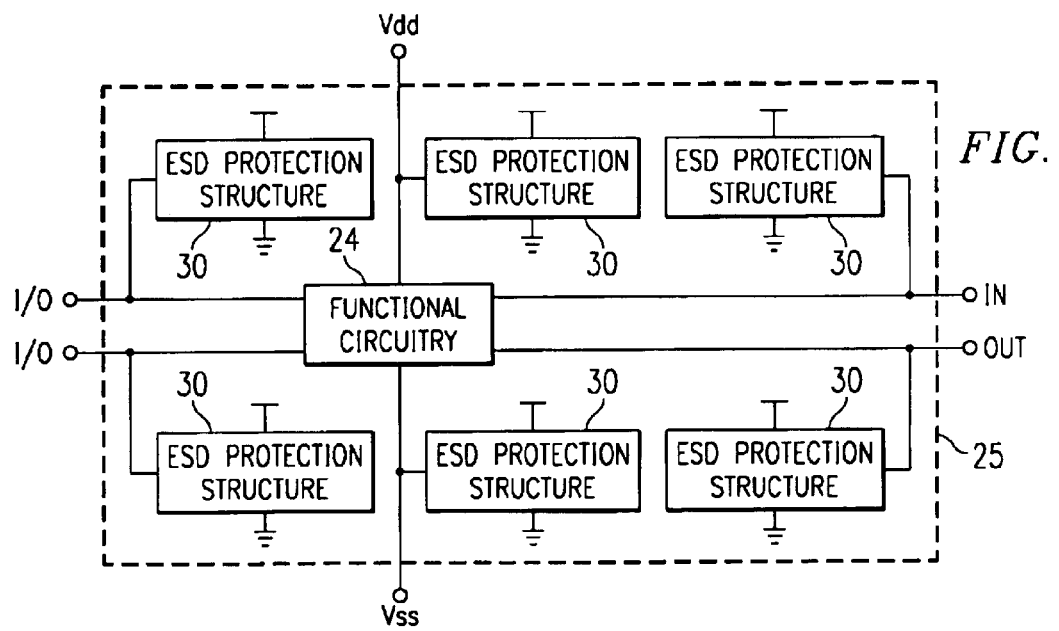

DRAIN-EXTENDED MOS ESD PROTECTION STRUCTURE

CROSS-REFERENCE TO RELATED APPLICATIONS

This application is a divisional of application Ser. No. 10/163,712, filed June 5, 2002 now U.S. Pat. No. 6,624,487.

This application claims priority, under 35 U.S.C. §119(e), of Provisional Application No. 60/378,554, filed May 7, 2002.

STATEMENT REGARDING FEDERALLY SPONSORED RESEARCH OR DEVELOPMENT

Not applicable.

BACKGROUND OF THE INVENTION

This invention is in the field of semiconductor integrated circuits, and is more specifically directed to techniques for protecting integrated circuits from damage caused by electrostatic discharge.

Modern high-density integrated circuits are known to be vulnerable to damage from the electrostatic discharge (ESD) of a charged body (human or otherwise) as it physically contacts an integrated circuit. ESD damage occurs when the amount of charge exceeds the capability of the conduction path through the integrated circuit. The typical ESD failure mechanisms include thermal runaway resulting in junction shorting, and dielectric breakdown resulting in gate-junction shorting (e.g., in the metal-oxide-semiconductor, or MOS, context).

It is often difficult to analyze the ESD vulnerability of a given integrated circuit, because the charge versus time characteristics of ESD events vary quite widely among the various sources of ESD. In fact, the ESD protection of modern integrated circuits is characterized according to multiple models, each of which are intended to model a type of ESD. The Human Body Model (HBM) models discharge of a charged human contacting an integrated circuit, and is realized by a 150 pF capacitance discharging into the integrated circuit within about 100 nsec. The Machine Model (MM) models discharge from metal objects such as test and manufacturing equipment, and generally uses a higher capacitance with lower internal resistance than the HBM, resulting in even faster discharge times. The Charged Device Model (CDM) models a discharge from a charged integrated circuit to ground, rather than a discharge to the integrated circuit. These differences in discharge characteristics and polarity manifest themselves in different failure manifestations within the integrated circuit; indeed the conduction may follow different paths within the device.

To avoid damage from ESD, modern integrated circuits incorporate ESD protection devices at each external terminal. ESD protection devices generally operate by providing a high capacity conduction path, so that the brief but massive ESD charge may be safely conducted away from structures that are not capable of handling the event. In some cases, ESD protection is inherent to the particular terminal, as in the case of a power supply terminal which may provide an extremely large p-n junction capable of conducting the ESD charge. Inputs and outputs, on the other hand, typically have a separate ESD protection device added in parallel to the functional terminal. The ideal ESD protection device turns on quickly in response to an ESD event, with large conduction capability, but remains off and presents no load during normal operation.

Examples of ESD protection devices are well known in the art. In the case of MOS technology, an early ESD protection device was provided by a parasitic thick-field oxide MOS transistor that was turned on by and conducted ESD current, as described in U.S. Pat. No. 4,692,781 and in U.S. Pat. No. 4,855,620, both assigned to Texas Instruments Incorporated and incorporated herein by this reference. As the feature sizes of MOS integrated circuits became smaller, and with the advent of complementary MOS (CMOS) technology, the most popular ESD protection devices utilized a parasitic bipolar device to conduct the ESD current, triggered by way of a silicon-controlled-rectifier (SCR) structure, as described in Rountree et al., "A Process-Tolerant Input Protection Circuit for Advanced CMOS Processes", 1988 EOS/ESD *Symposium*, pp. 201–205, incorporated herein by this reference, and in U.S. Pat. No. 5,012,317 and U.S. Pat. No. 5,307,462, both assigned to Texas Instruments Incorporated and also incorporated herein by this reference.

It has been observed that changes in integrated circuit manufacturing technology often necessitate changes in the ESD protection scheme, generally because the process changes alter the ability of the ESD protection devices to operate. The silicide cladding of junctions and the incorporation of shallow trench isolation (STI) have been observed to reduce the gain of the parasitic bipolar device in the SCR protection scheme, preventing proper triggering and conduction. The effects of these process changes are exacerbated by the continuing trend toward smaller device feature sizes, both laterally and vertically, rendering the devices ever more fragile to ESD.

However, the continued progression toward smaller device sizes has not, in many cases, relaxed the voltage requirements of integrated circuit terminals. For example, a modern manufacturing process fabricates transistors having $0.18\mu$ channel lengths, with a gate dielectric thickness of 7 nm or less, for use in integrated circuits that must still tolerate operating voltages of up to 7 volts at input/output terminals. Many integrated circuits are also required to have "failsafe" inputs and outputs, meaning that the terminal cannot be clamped to any power supply rail, so that large currents are not conducted from terminal voltages when the device is in an "off" state. The "failsafe" constraint is especially important in multi-voltage systems in which the inputs and outputs are power sequenced.

The high operating voltage and failsafe design constraints have been addressed through the use of drain-extended MOS transistors (referred to as DE, DEMOS, or DENMOS in the case of n-channel devices). A conventional DE transistor has its drain region located within a well of the same conductivity type; for example, in the n-channel case, the n-type drain region is placed within a relatively lightly-doped n-type well. The increased drain-to-substrate junction area provided by the well, along with the reduced dopant concentration at the drain-to-substrate junction, greatly increases the junction breakdown voltage, permitting high voltage operation of the transistor while tolerating voltage excursions at the drain that can occur in the absence of a clamp. DEMOS transistors also enable the use of thinner gate oxide, because the voltage drop across the depletion region of the well reduces the electric field at the drain-side edge of the gate oxide, and thus reduces the number of channel "hot" carriers that are produced. This reduction in "hot" carrier effects, specifically threshold voltage shift, enables the construction of reliable transistors with extremely thin gate oxides. DEMOS devices also present high output impedance, which is especially attractive in using the device in analog circuits. DEMOS transistors are therefore very attractive for use at input/output terminals of modern integrated circuits.

It has been observed, however, that DEMOS devices themselves provide very poor inherent ESD protection. Referring to FIG. 1a, plot 2 illustrates source-drain current versus drain-to-source voltage for DENMOS transistor 6 (FIG. 1b), with the gate grounded as shown in FIG. 1b. Plot 2 represents actual measurements of transistor 6, of drain-extended construction to have an effective channel length of 0.64μ and a channel width of about 50μ, measured from a sequence of 100 nsec pulses of increasing voltage applied to the drain of transistor 6. As shown by plot 2 of FIG. 1a, drain avalanche breakdown of transistor 6 occurs at about 13 volts drain-to-source-voltage. Unlike conventional ESD protection devices, however, there is no parasitic lateral npn bipolar conduction in transistor 6, and thus no "snapback" region in characteristic plot 2 (as shown by the ideal plot 2' in FIG. 1a). Instead, a relatively high "on" resistance of about 20 ohms is evident, with conduction continuing until about 17 volts, at which point thermal runaway causes device failure (evident by the knee in plot 2 at that point). While gate-coupled DENMOS devices have exhibited some snapback in their characteristic, it has been found that the failure current (i.e., the thermal runaway point in the characteristic) does not scale with channel width in these DENMOS devices. The failure mechanism in these devices has also been observed to be non-uniform conduction, from localized breakdown.

The protection of DENMOS devices by way of an SCR structure in combination with a grounded gate DENMOS device has been described in Kunz et al., "5-V Tolerant Fail-safe ESD Solutions for 0.18 μm Logic CMOS Process", ESD/EOS *Symposium* (Sep. 11, 2001), incorporated herein by this reference, and is illustrated, in cross-section, in FIG. 2a. In this example, DENMOS transistor 9 is in parallel with SCR 11. Source region 12 of transistor 9 is connected to ground, while drain 14 is located within n-well 10, and is connected to anode A of SCR 11 along with p+ region 16. P+ region 16 and n+ drain region 14 are separated from one another by shallow trench isolation structure 15, which is typically silicon dioxide deposited into a shallow trench. P+ region 16 is also located within n-well 10, as is a portion of n+ trigger region 18 in SCR 11. Cathode K of SCR 11 is biased to ground, and is connected to n+ region 20, which is disposed within p-type substrate 8 along with source region 12. Each of heavily-doped regions 12, 14, 16, 18, 20 are clad with metal silicide film 28, as are other diffused regions within the same integrated circuit, for improved conductivity. In this structure of FIG. 2a, the blocking of silicide formation is effected by nitride structures 22 and polysilicon gate 24, formed by conventional photolithography and patterned etches. Gate 24 is of course the gate electrode for DENMOS transistor 9, and its nitride structures 22 are sidewall filaments formed in the usual manner. More specifically, nitride structures 22 between p+ region 16 and n+ region 18 blocks the formation of silicide and also blocks the source/drain implants, but since these structures 22 are not adjacent gate polysilicon 24, the formation of these blocking nitride structures 22 requires an additional photolithography and etching step.

FIG. 2b is an electrical schematic of the structure of FIG. 2a, in its role as an ESD protection device. SCR 11 includes npn transistor 11n and pnp transistor 11p, with the collector of transistor 11p connected to the base of transistor 11n by the resistance through substrate 8. Transistor 11p has p+ region 16 as its emitter, n-well 10 as its base, and substrate 8 as its collector. Transistor 11n of SCR 11 has n+ region 20 as its emitter, n+ region 18 as its collector and as the trigger for SCR 11, and substrate 8 as its base. In operation, SCR 11 is triggered by the forward biasing of the emitter-base junction of transistor 11p. This forward-bias current enters n+ region 18, and causes breakdown of the junction between n+ region 18 and substrate 8, in turn triggering bipolar conduction by transistor 11n. As described in the Kunz et al. article, the voltage at which n+ region triggers the SCR action depends on strongly on the width of the channel between n+ regions 18, 20 that underlies nitride structure 22.

Because of the conductivity of n-well 10, the collector current of transistor 11p becomes base current for the parasitic npn transistor 9n of DENMOS transistor 9, causing this device to conduct. The parasitic bipolar transistor 9n at DENMOS transistor 9 thus assists in the dissipation of the charge presented to anode A through n+ source region 12, which serves as secondary cathode SK. The structure of FIG. 2a thus has been found to provide good ESD protection.

However, the structure of FIG. 2a requires the blocking of silicide and shallow trench isolation formation, specifically by requiring an additional photolithography operation to form nitride structures 22. This additional process step of course adds significant manufacturing cost to the integrated circuit embodying the structure. In addition, it has been observed that the structure of FIG. 2a is not suitable for use in connection with terminals, such as power supply terminals, at which a low output impedance is required.

By way of further background, U.S. Pat. No. 5,940,258, assigned to Texas Instruments Incorporated and incorporated herein by this reference, describes an ESD protection circuit in which a portion of the energy from the ESD pulse itself is used to bias the substrate of the protection circuit. Specifically, this diverted energy raises the substrate bias voltage in the vicinity of the primary discharge device, facilitating its bipolar conduction of the ESD energy. This substrate bias improves the response of the ESD protection device, while not affecting normal operation of the integrated circuit. According to this approach, a capacitor is used to provide the substrate bias current. However, the use of a capacitor as a primary element in an ESD protection device is not favored in integrated circuits using extremely thin gate dielectric films, having thicknesses of 7 nm or less.

BRIEF SUMMARY OF THE INVENTION

It is therefore an object of this invention to provide an electrostatic discharge (ESD) protection structure that is suitable for use in connection with drain-extended metal-oxide semiconductor (DEMOS) fabrication technology.

It is a further object of this invention to provide such a structure which can be easily fabricated without requiring an additional photolithography operation.

It is a further object of this invention to provide such a structure that is compatible for use in connection with low impedance terminals of the integrated circuit.

It is a further object of this invention to provide such a structure that is compatible for integrated circuits fabricated according to high density and high integration technologies, including extremely thin gate dielectric layers, silicide cladding, and shallow trench isolation.

Other objects and advantages of the present invention will be apparent to those of ordinary skill in the art having reference to the following specification together with its drawings.

The present invention may be implemented as a pair of drain-extended MOS devices, both having drains coupled to the terminal being protected. One of the devices serves as a substrate pump device, and is fabricated so that its extended drain underlies its gate electrode, establishing a significant gate to drain capacitance that couples ESD energy to gates of the drain-extended MOS devices. As the pump device is turned on, it conducts current to the body node, or channel, of the second drain-extended device, forward-biasing the base-emitter junction of the parasitic bipolar transistor in the protection DEMOS device, initiating bipolar conduction and safely conducting the ESD energy to ground. A control circuit is provided to ensure that the pair of DEMOS devices are turned off during normal operation.

BRIEF DESCRIPTION OF THE SEVERAL VIEWS OF THE DRAWING

FIG. 1a is a current-voltage plot illustrating the ESD protection behavior of a conventional gate-grounded DEMOS transistor.

FIG. 1b is an electrical diagram, in schematic form, of the conventional gate-grounded DEMOS transistor having the behavior illustrated in FIG. 1a.

FIG. 2b is an electrical diagram, in schematic form, illustrating the parasitic bipolar devices involved in the operation of the structure of FIG. 2a in its ESD protection role.

FIG. 3 is an electrical diagram, in block form, illustrating an integrated circuit utilizing the ESD protection structures according to the preferred embodiment of the invention.

DETAILED DESCRIPTION OF THE INVENTION

This invention is directed to the protection of integrated circuits from electrostatic discharge (ESD), and will be described in this specification in connection with several preferred embodiments for which this invention is contemplated to be particularly beneficial. However, it is also contemplated that this invention will be of similar benefit in many applications and in realizations other than those described in this specification. It is therefore to be understood that these and other alternatives to the described embodiments are within the scope of the invention as claimed.

FIG. 3 illustrates, at a high level, the construction of integrated circuit 25 into which the preferred embodiments of the invention may be incorporated. Integrated circuit 25 includes functional circuitry 24, which is the circuitry that realizes and carries out the desired functionality of integrated circuit 25. The capability of functional circuitry 24 may of course vary widely, for example ranging from a simple buffer or interface, on one hand, to an extremely complex programmable device such as a digital signal processor (DSP). The specific functionality contained within functional circuitry 24 is not of particular importance to the preferred embodiments of the invention.

Integrated circuit 25 also includes a number of external terminals, by way of which functional circuitry 24 carries out its function. A few of those external terminals are illustrated in FIG. 3 by way of example. It is to be understood that the number of terminals and their function can also vary widely (up to on the order of one hundred terminals in some cases). In the example of FIG. 3, two terminals I/O operate as common input and output terminals, by way of which functional circuitry 24 can receive incoming signals and can generate outputs, as known in the art. A dedicated input terminal IN is also shown in FIG. 3 for integrated circuit, as is a dedicated output terminal OUT; each of terminals IN, OUT are also connected to functional circuitry 24. Power supply terminal Vdd receives a positive power supply voltage in this example, while ground terminal Vss is provided to receive a reference voltage, such as system ground.

According to the preferred embodiments of the invention, integrated circuit 25 includes an instance of ESD protection structure 30 connected to each of its terminals. Each ESD protection structure 30 is connected to its corresponding terminal in parallel with functional circuitry 24. As evident in FIG. 3, ESD protection structures 30 are also connected to power supply and reference voltage terminals $V_{dd}$, $V_{ss}$, in parallel with functional circuitry 24. As will be evident from the following description, ESD protection structure 30 is well-suited for this wide range of terminal functions, including power supply terminals that are necessarily required to have low input impedance.

Figure 4:
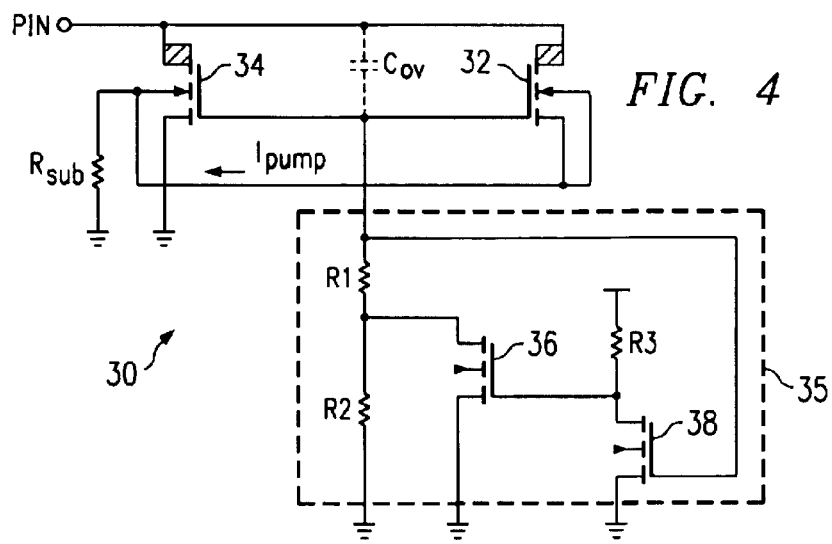
FIG. 4 is an electrical diagram, in schematic form, illustrating an ESD protection structure according to a first preferred embodiment of the invention.

Referring now to FIG. 4, the electrical arrangement of ESD protection structure 30, constructed according to a first preferred embodiment of the invention, will now be described. As shown in FIG. 4, ESD protection structure 30 is connected to terminal PIN, which may correspond to any one of the terminals of integrated circuit 25 (i.e., one of terminals IN, OUT, I/O, $V_{dd}$, $V_{ss}$). Terminal PIN is connected to the drains of drain-extended MOS transistors 32, 34 in ESD protection structure 30. In this embodiment of the invention, DEMOS transistor 32 performs the function of pumping the substrate node of DEMOS transistor 34. DEMOS transistor 34, according to this embodiment of the invention, in turn performs the function of conducting the bulk of the current generated in an ESD event at terminal PIN.

Figure 5:
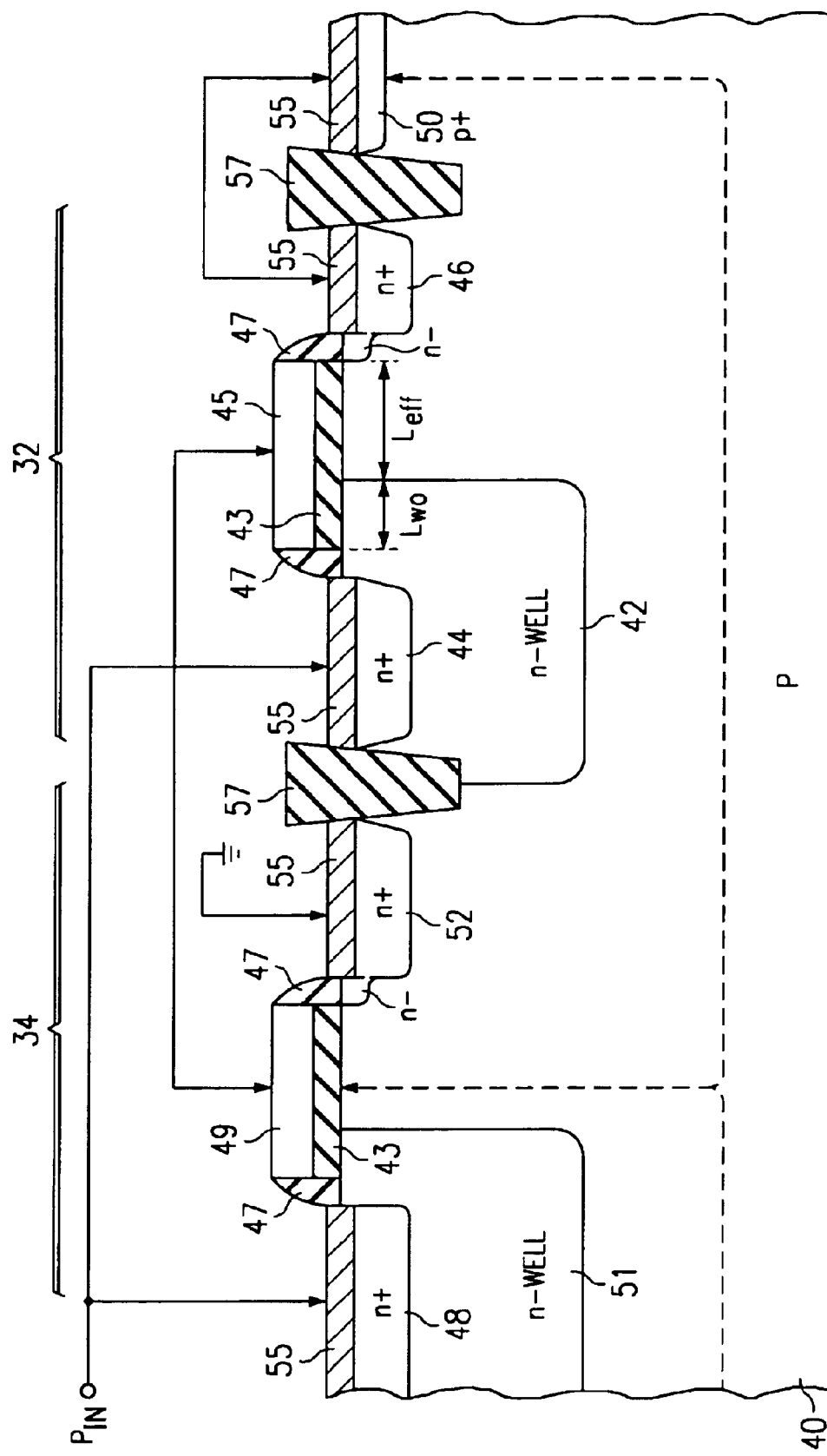
FIG. 5 is a cross-sectional diagram illustrating the construction of the pump DEMOS transistor in the ESD protection structure of FIG. 4 according to the first preferred embodiment of the invention.

In this embodiment of the invention, DEMOS transistors 32, 34 are both n-channel enhancement-mode devices; it is of course contemplated that these devices may alternatively be implemented as p-channel enhancement-mode devices, with the appropriate connections. DEMOS transistor 32 has its source connected to its body node, and to the body node of DEMOS transistor 34. Alternatively, the body node of DEMOS transistor 32 may be coupled to ground. As will become apparent from the following description, this connection of the source of DEMOS transistor 32 to the body nodes of transistors 32, 34 is preferably made by way of a connection to a guard ring surrounding ESD protection structure 30. The gates of DEMOS transistors 32, 34 are connected to one another, and to control circuit 35. Also according to this first preferred embodiment of the invention, DEMOS transistor 32 is constructed to have significant gate-to-drain capacitance, shown in FIG. 4 by capacitor $C_{ov}$. Referring now to FIG. 5, the construction of DEMOS transistors 32, 34 according to the preferred embodiments of the invention will now be described.

In the cross-sectional view of DEMOS transistors 32, 34 shown in FIG. 5, each device is formed at a surface of p-type substrate 40, which may be a conventional bulk substrate, an epitaxial layer, a silicon-on-insulator (SOI) region, a p-type well within one of these structures, or the like. DEMOS transistor 32 includes n+ drain region 44 disposed within n-type well 42, and n+ source region 46 disposed at a surface of p-type substrate 40. Gate electrode 45 overlies the channel region between n+ drain region 44 and n+ source region 46, and is insulated from the channel region by gate dielectric 43. According to this embodiment of the invention, gate dielectric 43 is an extremely thin layer, for example on the order of 7 nm or thinner, and preferably consists of silicon dioxide, silicon nitride, or a combination of these materials. Gate electrode 45 is preferably formed of polycrystalline silicon (polysilicon), or a refractory metal. Similarly, DEMOS transistor 34 includes n+ drain region 48, also disposed within n-well 51, and n+ region 52 disposed at a surface of substrate 40. Gate electrode 49 overlies gate dielectric 43 and the channel region between drain region 48 and source region 52. Each of source and drain regions 44, 46, 48, 52 (and also gate electrodes 45, 49, not shown) may be clad with silicide film 55 in the conventional manner. In addition, source regions 46, 52 preferably include lightly-doped portions, extending under sidewall filaments 47 disposed along the sides of gate electrodes 45, 49. A conventional pocket p+ implant may also be provided for source regions 46, 52 near their respective gate electrodes 45, 49, if desired. DEMOS transistors 32, 34 are preferably isolated from one another at the surface of structure 30, for example by shallow trench isolation structures 57; alternatively, isolation may be effected by conventional field oxide structures.

Referring back to FIG. 4 in combination with FIG. 5, gate electrodes 45, 49 are connected together, preferably by way of a metal strap or other patterned conductor (shown in FIG. 5 only in a schematic sense). Drain regions 44, 48 are similarly connected together, and to terminal PIN, while source region 52 is connected to ground. Source region 46 of DEMOS transistor 46 is strapped to p+ guard ring 50, also preferably by way of a metal or other patterned conductor system suitable for connecting regions of opposite conductivity type.

As shown in FIG. 5, n-well 42 in DEMOS transistor 32 is significantly overlapped by gate electrode 45, by a distance $L_{wo}$. DEMOS transistor 34 also preferably has a similar gate-to-well overlap, but which is not essential for ESD protection by structure 30 according to this embodiment of the invention. Because of this overlap in DEMOS transistor 32, the remaining effective channel length $L_{eff}$ between the edge of n-well 42 and n+ source region 46 is thus significantly shorter than the full width of gate electrode 45 in this device. In addition, as will be discussed below, the effective channel length $L_{eff}$ of DEMOS transistor 32 is also preferably shorter than the channel length of DEMOS transistor 34. According to this embodiment of the invention, the overlap $L_{wo}$ in DEMOS transistor 32 is selected to define a sufficient gate-to-drain capacitance $C_{ov}$ (FIG. 4) to couple ESD charge from terminal PIN to gate electrodes 45, 49. As will be described below, this diversion will have the effect of turning on DEMOS transistor 32 in the MOS sense, and DEMOS transistor 34 in both the MOS sense and, more efficiently, in the bipolar sense.

Referring back to FIG. 4, control circuit 35 according to this preferred embodiment of the invention is provided to ensure that DEMOS transistors 32, 34 can be turned on by an ESD event, but will remain off during normal operation. In this exemplary embodiment of the invention, the gates of DEMOS transistors 32, 34 are connected to ground through a voltage divider of resistors R1, R2. In this embodiment of the invention, resistor R2 is preferably substantially larger than resistor R1; resistor R1 may in fact have a very low, or effectively zero, resistance. The node between resistors R1, R2 is connected to the drain of n-channel transistor 36, which has its source at ground. Resistor R3 is connected in series with the source-drain path of n-channel transistor 38, between power supply $V_{dd}$ and ground. The gate of transistor 36 is connected to the drain of transistor 38, while the gate of transistor 38 is connected to the gates of DEMOS transistors 32, 34.

The operation of ESD protection structure 30 according to this first embodiment of the invention will now be described in detail, relative to FIGS. 4 and 5. In this example, a positive ESD event is received by terminal PIN from an external charged body, with integrated circuit 25 not being biased (i.e., no voltage at power supply $V_{dd}$). In this "off" state, the initial state of the gates of transistors 32, 34 is at ground. Referring to FIGS. 4 and 5, the substantial amount of charge of this positive ESD event is conducted from terminal PIN directly to the drains of DEMOS transistors 32, 34, in the form of a current spike. Because of the gate-to-drain capacitance $C_{ov}$ resulting from the overlap of gate electrode 45 over n-well 42, the current spike couples to gate electrode 45 of DEMOS transistor 32, and also to gate electrode 49 of DEMOS transistor 34. This coupling raises the voltage of the gates of DEMOS transistors 32, 34, from the voltage drop across resistors R1, R2 in control circuit 35 which conduct this coupled charge to ground.

Upon the voltage at the gate of DEMOS transistor 32 exceeding the device threshold voltage, DEMOS transistor 32 will turn on, and conduct at least some of the ESD energy from drain to source, and to substrate 40 via the connection of source region 46 to p+ guard ring 50 (FIG. 5). This current is injected into the p-type body node of DEMOS transistor 34, as shown in FIG. 4 as current $I_{pump}$. In effect, as shown in FIG. 4, the bulk of current $I_{pump}$ will be conducted through substrate 40 to ground, with the resistance of substrate 40 appearing as parasitic resistance $R_{sub}$. Meanwhile, the ESD energy will similarly couple to the gate of DEMOS transistor 34, so that DEMOS transistor 34 also conducts MOS current, which provides substrate current that adds with current $I_{pump}$ from DEMOS transistor 32. If the ESD event is sufficiently large, the current conducted through substrate 40 (primarily from DEMOS transistor 32, but also from DEMOS transistor 34) will raise the voltage of substrate 40 to a level that forward biases the junction between substrate 40 and n+ source region 52. This forward biased junction corresponds to the emitter-base junction of the parasitic npn transistor formed by DEMOS transistor 34, in which the collector corresponds to n+ region 48 and n-well 51, the base corresponds to substrate 40 in the channel region underlying gate electrode 49, and the emitter corresponds to n+ region 52. With the base-emitter junction forward biased by this diverted ESD energy, bipolar conduction of the ESD charge from n+ region 48 to n+ region 52 is initiated. This bipolar conduction is contemplated to be sufficiently large as to safely dissipate the ESD event, without harming functional circuitry (24) that is connected to terminal PIN. To the extent that the ESD event also turns on DEMOS transistor 34 in the MOS sense, particularly if significant gate-to-well overlap is present as shown in FIG. 5, this MOS conduction through transistor 34 directly conducts the ESD energy, and also adds substrate current to current $I_{pump}$ to assist in the triggering of npn bipolar conduction through DEMOS transistor 34.

A negative polarity ESD event can be caused by an external body charged negatively relative to integrated circuit 25 and contacting terminal PIN, such that the direction of current is from integrated circuit 25 out of terminal PIN. An example of this type of event is that modeled by the Charged Device Model (CDM), in which integrated circuit 25 is charged relative to the external body. ESD protection structure 30 is well suited for handling these negative polarity events, because of drain extended devices 32, 34. The deep drain-extended junctions, at the interface between n-wells 42, 51 and substrate 40 as shown in FIG. 5, provide a large junction area capable of handling current from substrate 40 to terminal PIN when forward-biased by the negative polarity ESD event.

Referring back to FIG. 4, control circuit 35 operates to minimize the loading effect of DEMOS transistors 32, 34 on terminal PIN and thus on functional circuitry 24. Upon power supply $V_{dd}$ being powered up, transistor 36 in control circuit 35 is turned on, shorting out resistor R2. Because resistor R1 is much smaller than resistor R1, preferably having on the order of 3% of the resistance of resistor R2, transistor 36 will draw its drain voltage, and thus the voltage at the gates of DEMOS transistors 32, 34, nearly to ground. This voltage also appears at the gate of transistor 38, turning it off and thus maintaining a strong high voltage at the gate of transistor 36. DEMOS transistors 32, 34 are therefore held strongly off, in normal operation once power supply $V_{dd}$ is powered up. Resistor R3 between power supply $V_{dd}$ and the gate of transistor 38 delays the turning on of transistor 36 as power supply $V_{dd}$ powers up, so that an ESD event at the power supply $V_{dd}$ terminal itself will not turn on transistor 38 for ESD structure 30 at terminals other than $V_{dd}$. Furthermore, any residual charge at the gate of transistor 36 remaining after power down of power supply $V_{dd}$ will be rapidly discharged by transistor 38, thus ensuring that both resistors R1, R2 are available to raise the gate voltages of DEMOS transistors 32, 34 for subsequent ESD events.

The ESD protection performance of structure 30 according to this first preferred embodiment of the invention can be optimized by adjustment of the gate-to-well overlap distance $L_{wo}$, and the effective channel length $L_{eff}$, of DEMOS transistor 32. The overlap distance $L_{wo}$ determines the capacitive coupling of the ESD charge to the gates of DEMOS transistors 32 and 34, and thus determines the response of structure 30 to an ESD event. The effective channel length $L_{eff}$ of DEMOS transistor 32 can also be optimized, preferably to be quite short so that the ESD charge is rapidly conducted through DEMOS transistor 32 once it is turned on by the voltage rise at its gate. It is also contemplated that the current at which thermal runaway is initiated (this current commonly referred to as $I_{t2}$) increases as effective channel length $L_{eff}$ decreases.

In conventional MOS transistors, including DEMOS transistors, extremely short channel length transistors are not favored because of hot electron effects, also referred to as hot carrier effects. As is well known in the art, if the electric field at the drain junction of a MOS transistor is sufficiently high, free carriers can gain sufficient energy to overcome the gate dielectric barrier, and can become trapped in the gate dielectric and eventually change the threshold voltage of the device. Because an extremely short channel increases this electric field, and because extremely thin gate dielectrics are more easily penetrable by hot carriers, conventional MOS and DEMOS transistors in ESD protection structures must have sufficiently long effective channel lengths and relatively thick gate dielectric films in order to avoid hot electron effects.

DEMOS transistor 32 according to this embodiment of the invention is substantially immune to hot electron effects, however, and as such its effective channel length $L_{eff}$ can be quite short, even for extremely thin gate dielectric 43. Preferably, the effective channel length $L_{eff}$ of DEMOS transistor 32 is shorter than that of DEMOS transistor 34, for example by about 0.2 μm, to increase the drive current of DEMOS transistor 32 and thus improve the pumping efficiency. The hot electron immunity of DEMOS transistor 32 is due in large part to the effect of control circuit 35, which maintains DEMOS transistor 32 off during normal operation. Because DEMOS transistor 32 is off except during ESD events, the time over which hot carriers are generated and can become trapped in DEMOS transistor 32 is infinitesimally short. Secondly, because substrate 40 is pumped by DEMOS transistor 32 during those times in which DEMOS transistor 32 is on, the electric field at the drain junction of DEMOS transistor 32 is reduced, further reducing the likelihood and number of hot carriers that are produced during this brief period. Accordingly, the effective channel length of DEMOS transistor 32 can be reduced to well beyond the design limit that is in place for other transistors in integrated circuit 25 to avoid hot electron effects, even with extremely thin gate dielectric 43 on the order of 7 nm or less. For example, an overlap $L_{wo}$ of 0.2 μm and an effective channel length $L_{eff}$ of 0.5 μm is suitable for DEMOS transistor 32 having a channel width of 40 μm per finger, and a gate dielectric 43 thickness of 7 nm. By way of example, DEMOS transistor 32 constructed according to these parameters has been observed to provide enough substrate current for DEMOS transistor 34 to result in an $I_{t2}$ current of as high as 1.5 mA for each μm of channel width for DEMOS transistor 34.

Figure 6:
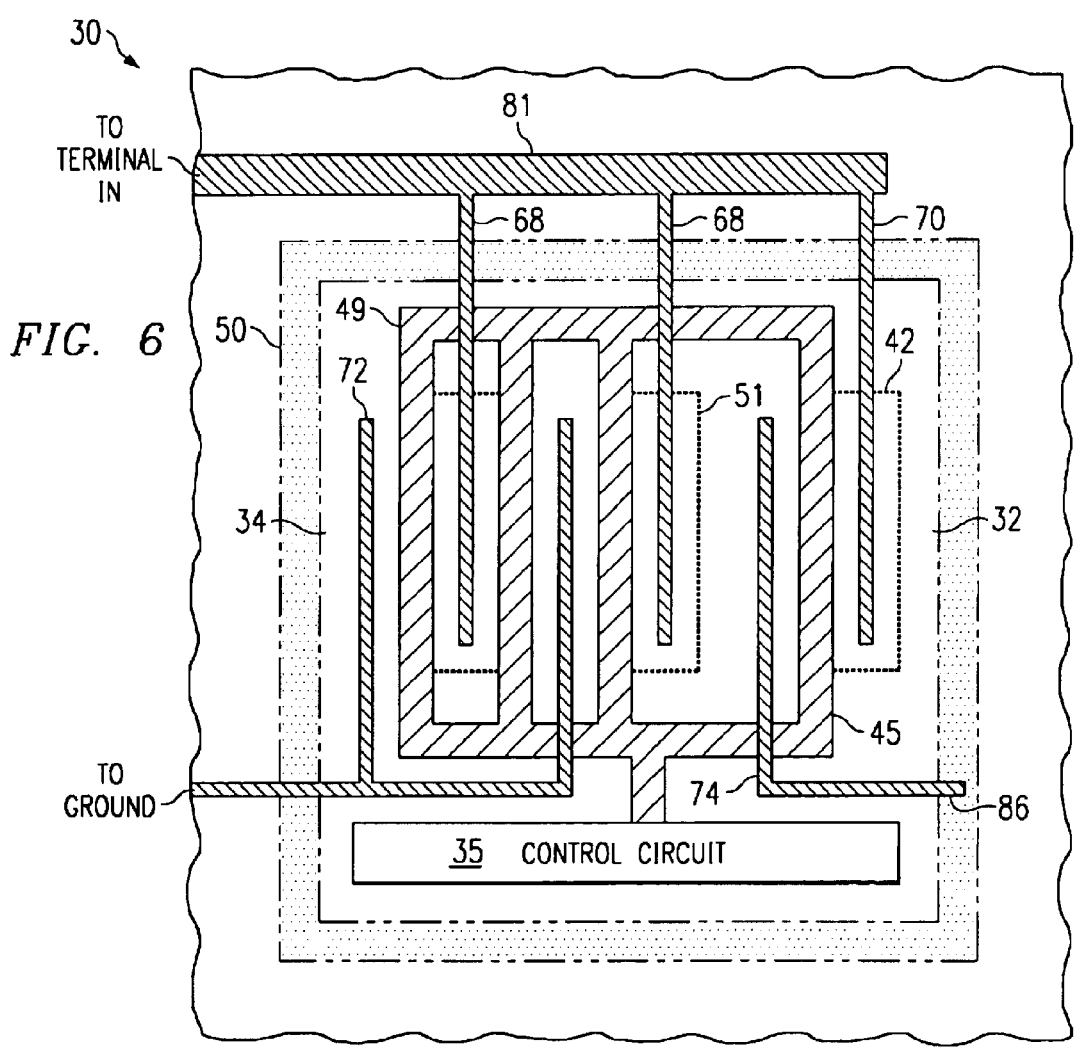
FIG. 6 is a plan view of the ESD protection structure of FIG. 4 according to the first preferred embodiment of the invention.

Referring now to FIG. 6, a simplified plan view of ESD protection structure 30 according to the preferred embodiment of the invention will now be described. The arrangement of structure 30 shown in this plan view does not necessarily align with the specific layout of the cross-sectional view of FIG. 5, but includes the same structural elements, to which reference will be made by way of the same reference numerals as appropriate. The skilled reader will also realize that a typical realization of ESD protection structure 30 in an actual integrated circuit will significantly scale up structure 30 from that shown in FIG. 6, most likely by increasing the transistor size and number of interdigitations for each device. Further in the alternative, DEMOS transistor 32 may be implemented outside of p+ guard ring 50.

As shown in FIG. 6, metal conductor 81 connects to the bond pad (not shown) associated with terminal IN. Metal conductors 68 extend from conductor 81 to contact drain regions 48 (not visible in FIG. 6) of DEMOS transistor 34, by way of contacts through an interlevel dielectric film (also not visible in FIG. 6). Each drain region of DEMOS transistor 34 is disposed within n-well 51, the edges of which are aligned with or underlie gate electrode 49. Similarly metal conductor 70 extends from conductor 81 to contact drain region 46 (not visible) of DEMOS transistor 32, which is disposed within n-well 42. The isolation structures (e.g., shallow trench isolation structures 57) are not visible in FIG. 6, it being understood that the various source and drain regions are isolated from one another as shown in FIG. 5.

Gate electrodes 45, 49 are interconnected within a contiguous element of polysilicon, in this embodiment of the invention, with gate electrode 45 corresponding to the portion of this polysilicon element between the source and drain of DEMOS transistor 32, and gate electrode 49 corresponding to the portions of this element between the source and drain of DEMOS transistor 34. Control circuit 35 is shown in block form only in FIG. 6 for clarity, as the realization of control circuit 35 is well within the capability of those skilled in the art having reference to this specification. Conductors 72 also extend away from structure 30 to connect the source regions 52 of DEMOS transistor 34 to ground. Conductor 74, on the other hand, connects the source of DEMOS transistor 32 to p+ guard ring 50, by way of contact 86. P+ guard ring 50 surrounds both DEMOS transistors 32, 34, as shown in FIG. 6, to provide a minimum resistance path for ESD current from the source of DEMOS transistor 32 to the channel regions underlying gate electrode 49 in DEMOS transistor 34, as described above.

Figure 2A:
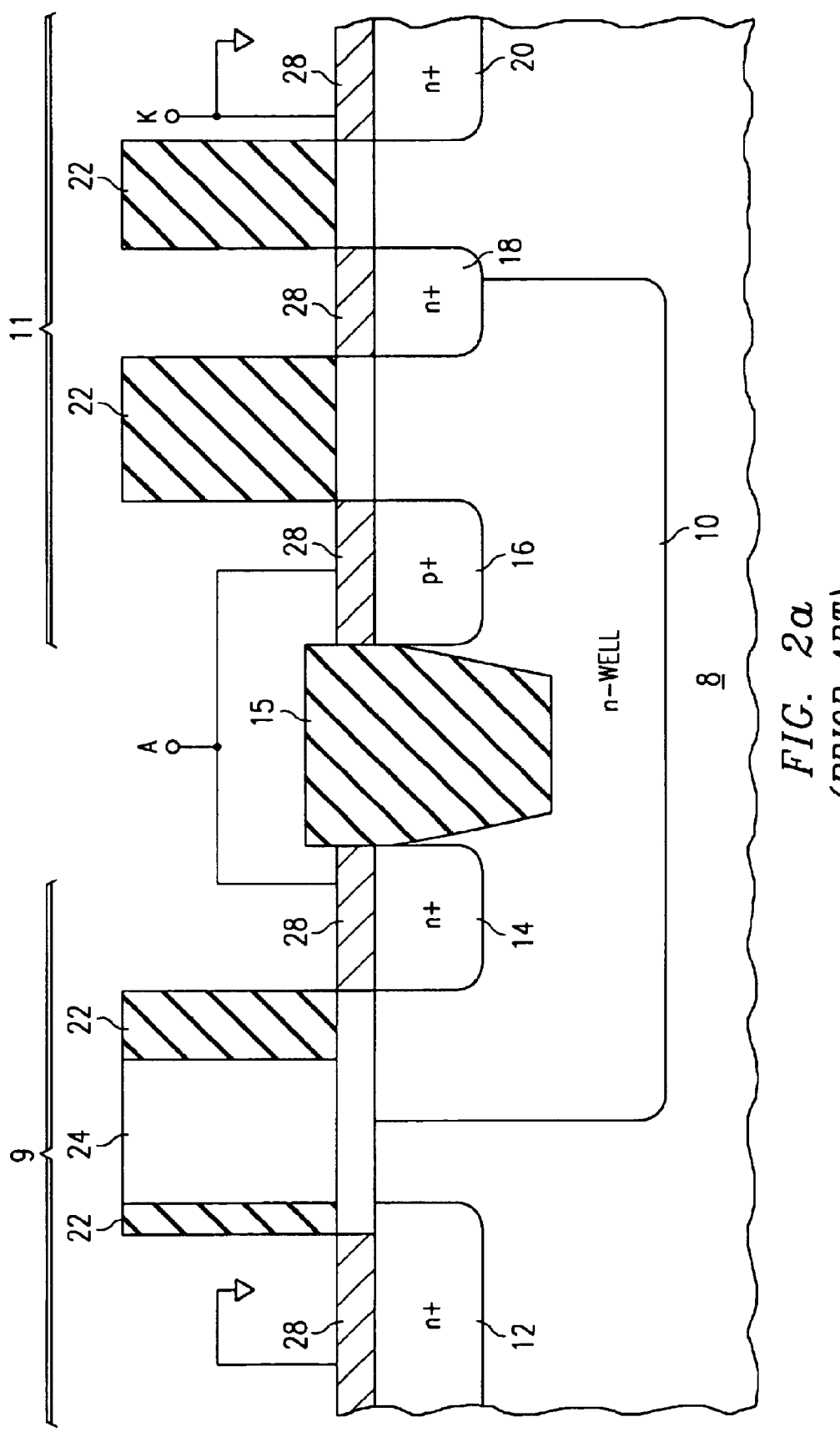
FIG. 2a is a cross-sectional diagram of a known SCR-type ESD protection structure involving a DEMOS transistor.

A particular benefit provided by this invention, as evident from the structures of FIGS. 5 and 6, is provided by the substrate pumping effected by DEMOS transistor 32. The conduction of current from surrounding guard ring 50 to DEMOS transistor 34, through substrate 40, is carried out regardless of the effect of any isolation structures that may be present within ESD protection structure 30. As such, any type of isolation structure may be incorporated within ESD protection structure 30 if desired, including shallow trench isolation as described above relative to FIG. 2a. The construction of ESD protection structure 30 does not require additional manufacturing cost and process steps, as in the conventional structure of FIG. 2a.

Figure 7:
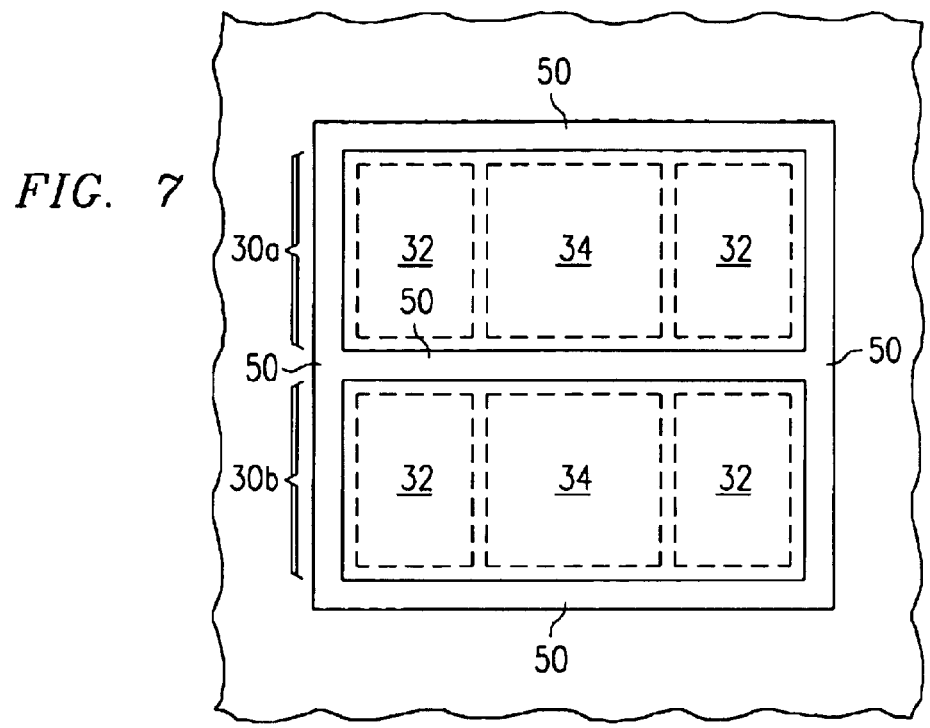
FIG. 7 is a plan view of the ESD protection structure of FIG. 4 according to the first preferred embodiment of the invention, illustrating its block scalability.

FIG. 7 illustrates another realization of ESD protection structure 30 according to the preferred embodiments of the invention. According to this realization, multiple instances of DEMOS transistors 32, 34 are constructed within multiple blocks 30a, 30b; preferably, each block 30a, 30b contains parallel sets of DEMOS transistors 32, 34, constructed in an interdigitated manner. Preferably, pump DEMOS transistors 32 are disposed symmetrically along the outer edges of each block 30a, 30b, with protection DEMOS transistors 34 disposed in the center of each block 30a, 30b, between pump DEMOS transistors 32. In any case, one or more DEMOS transistors 32, 34 are fabricated within each block 30a, 30b. For example, each block 30a, 30b may contain ten instances DEMOS transistor 32 in parallel, each of 20 µm channel width, and sixteen instances of DEMOS transistor 34 in parallel, each also of 20 µm channel width. Blocks 30a, 30b are defined by p+ guard ring 50', which surrounds each block 30a, 30b and which is also disposed between blocks 30a, 30b. According to this construction, the distance between p+ guard ring 50 and pump DEMOS transistors 32 is minimized, to improve the efficiency of conduction in response to an ESD event. On the other hand, this construction also maintains the distance between the channel region of any instance of DEMOS transistor 34 and p+ guard ring 50 to be equidistant, ensuring that all portions of DEMOS transistor 34 turn on for bipolar conduction in a substantially uniform manner. This distance is also preferably optimized to provide reasonable conduction between the channel region of DEMOS transistors 34 and p+ guard ring 50, while increasing the distance between the channel region of DEMOS transistors 34 and external p+ connections away from ESD structure 30 to implement adequate resistance to the current $I_{pump}$ to initiate bipolar conduction as described above. In total, the layout of FIG. 7 ensures uniform and adequate bipolar turn-on of DEMOS transistors 34 in response to an ESD event. ESD structure 30 according to this embodiment of the invention is preferably scaled in size by increasing the number of blocks 30a, 30b to reach the desired ESD drive. This scaling approach is preferred to that in which the channel width or number of channels in parallel are increased, because the block approach of this embodiment of the invention ensures that the effects of the pumped substrate are uniform among the instances and length of DEMOS transistors 34.

Figure 8:
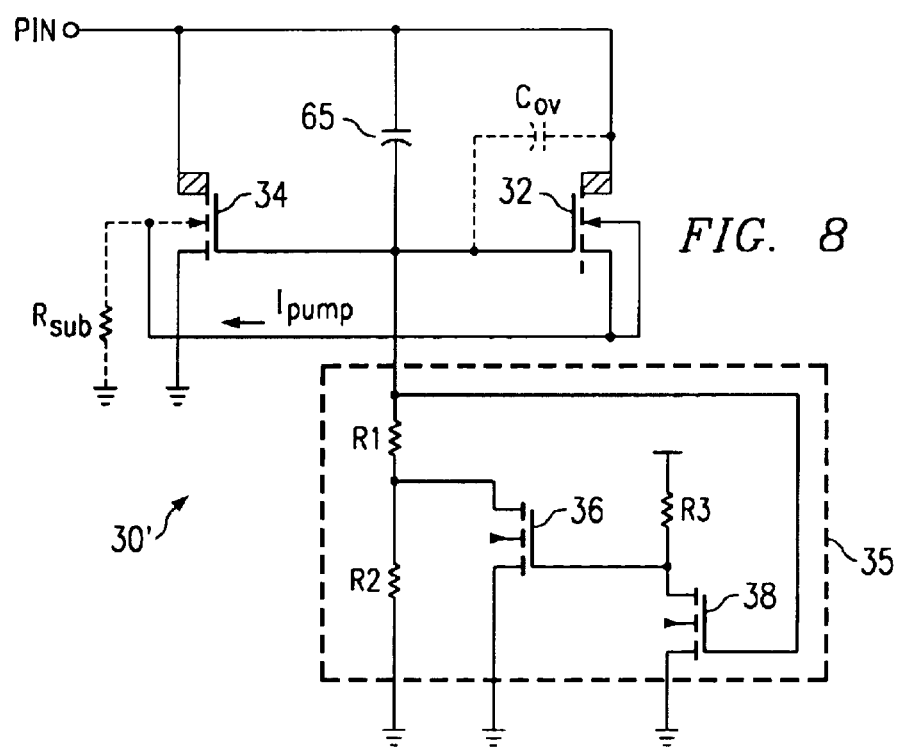
FIG. 8 is an electrical diagram, in schematic form, illustrating an ESD protection structure according to a second preferred embodiment of the invention.

Referring now to FIG. 8, ESD structure 30' according to a second preferred embodiment of the invention will now be described. Elements in ESD structure 30' that are identical to those in structure 30 of FIG. 4 are referred to by the same reference numerals, and their description will not be repeated here. ESD structure 30' includes capacitor 65, in parallel with parasitic capacitor $C_{ov}$ formed by the gate-to-drain overlap within DEMOS transistor 32. Capacitor 65 is preferably formed as a junction capacitor, so as not to have any thin gate dielectric that may be destroyed in the event of an ESD event (indeed, typical design rules do not permit the direct connection of an MOS gate to an external terminal). For example, capacitor 65 may be formed by an n-type diffusion into a p-type well, with terminal IN connected to the n-type diffusion (i.e., the cathode of the p-n diode) and the gates of DEMOS transistors 32, 34 connected to the p-well (the anode of the p-n diode). The capacitance value of capacitor 65 is not particularly critical, as any capacitance that it provides in addition to that of parasitic capacitor $C_{ov}$ will be helpful. It is contemplated that the skilled artisan having reference to this specification will be readily able to optimize the size of capacitor 65, by balancing the incremental ESD protection provided by capacitor 65 against the additional chip area required for its implementation.

ESD protection structure 30' operates in substantially the same manner as ESD protection structure 30 described above. Capacitor 65 provides additional coupling of the ESD event to the gates of DEMOS transistors 32, 34, which improves the ESD protection response. DEMOS transistor 32 is thus more rapidly turned on, and the ESD energy is more quickly pumped into substrate 40 by DEMOS transistor 32, initiating the parasitic bipolar conduction through DEMOS transistor 34 more quickly.

Figure 9A:
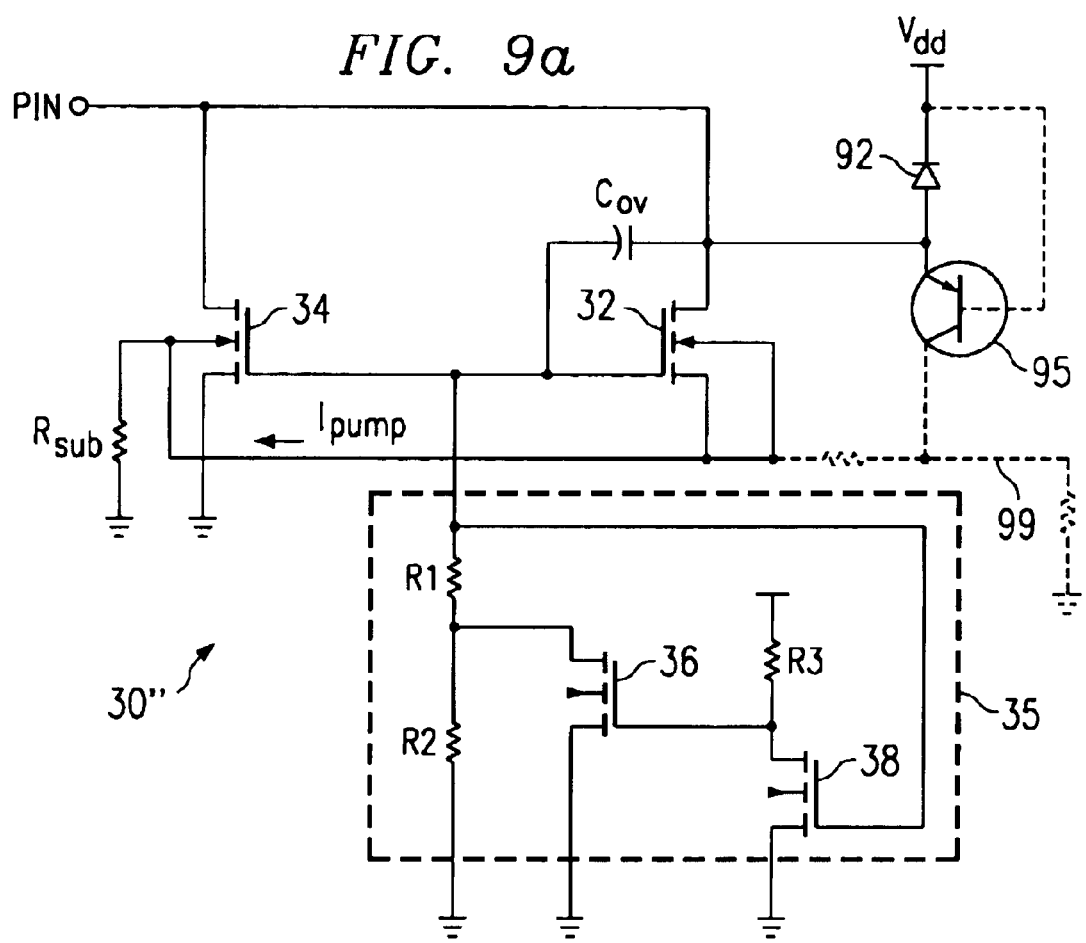
FIG. 9a is an electrical diagram, in schematic form, illustrating an ESD protection structure according to a third preferred embodiment of the invention.

Referring now to FIG. 9a, ESD protection structure 30" according to a third preferred embodiment of the invention will now be described. Again, elements in ESD structure 30" that are identical to those in structure 30 of FIG. 4 and structure 30' of FIG. 8 are referred to by the same reference numerals, and their description will not be repeated here. ESD protection structure 30" includes junction diode 92, which clamps terminal PIN to no more than a diode threshold drop above power supply voltage $V_{dd}$ in normal operation. In this embodiment of the invention, terminal PIN is not of the "failsafe" type, considering that it is clamped to this power supply voltage.

Figure 9B:
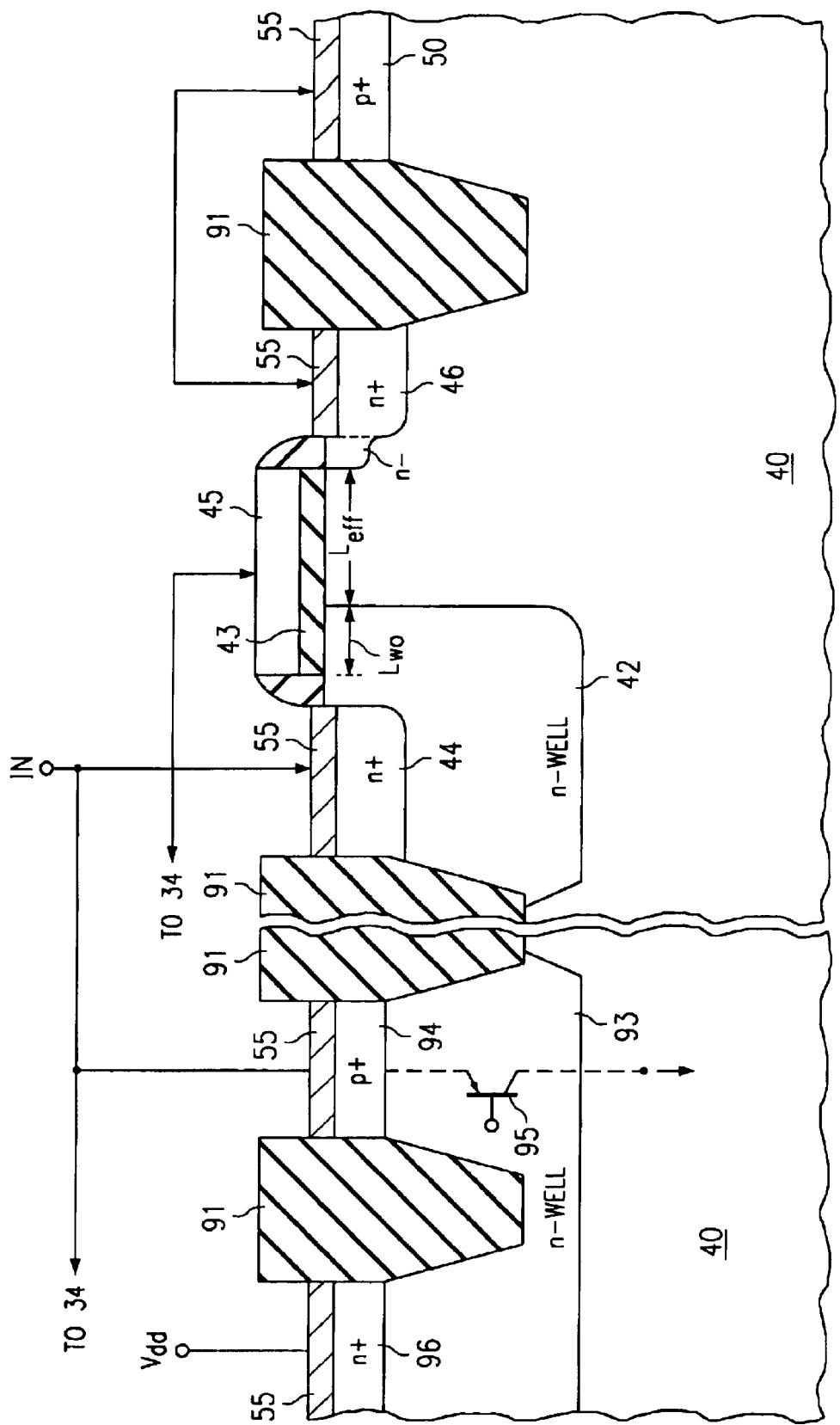
FIG. 9b is an electrical diagram, in schematic form, illustrating an ESD protection structure according to a third preferred embodiment of the invention.

FIG. 9b illustrates an exemplary implementation of junction diode 92, in combination with DEMOS transistor 32. DEMOS transistor 34 is not shown in FIG. 9b, but is preferably constructed in the manner described above. As shown in FIG. 9b, junction diode 92 is preferably formed by p+ diffusion 94 and n+ diffusion 96, both formed into n-well 93, which is separate from n-well 42 that also contains drain region 44 of DEMOS transistor 32. In this arrangement, p+ diffusion 94 serves as the anode of diode 92 and is connected by a metal conductor or otherwise to terminal IN, while n+ diffusion 96 serves as the cathode and is connected by way of a metal conductor or otherwise to power supply voltage $V_{dd}$, to which terminal IN is to be clamped. Also as shown in FIG. 9b, shallow trench isolation structures 91 are included in ESD structure 30" according to this embodiment of the invention. As will be described below, because the operation of structure 30" does not depend upon inversion of a channel in the isolation regions, shallow trench isolation structures 91 may be readily used within structure 30", eliminating any need for a blocking mask or film at these locations.

ESD protection structure 30" operates in a very similar manner as ESD protection structure 30 described above. According to this embodiment of the invention, however, clamping diode 92 assists in the injection of current into substrate 40, by way of parasitic bipolar conduction. In operation, diode 92 is forward biased by a positive ESD event. Specifically, the forward-biased junction between p+ region 94 and n-well 93 corresponds to a forward-biased emitter-base junction of the parasitic pnp transistor 95 having p+ region 94 as its emitter, n-well 93 as its base, and substrate 40 as its collector. Because n-well 93 is connected to a power supply node via n+ region 96, a large number of electrons are available to n-well 93, providing a transient base current as the ESD charge enters n-well 93 from p+ region 94. Bipolar conduction to substrate 40 from p+ region 94 thus commences, with this current conducted into substrate 40 (via parasitic resistor network 99 in FIG. 9a) and supplementing current $I_{pump}$. This current assists in the forward-biasing of the emitter-base junction of the parasitic npn device at DEMOS transistor 34, assisting turn-on of bipolar conduction and dissipation of the ESD energy from terminal IN. It has been observed, in connection with this preferred embodiment of the invention, that the bipolar conduction of parasitic pnp transistor 95 can significantly improve the ESD protection performance even over that of structures 30, 30' described above, providing HBM performance of up to 6 kV and failure current $I_{t2}$ levels of up to 9 mA/$\mu$m. Of course, clamping diode 92 according to this embodiment of the invention is not compatible with failsafe terminal requirements; alternatively, a series connection of additional clamping diodes 92 may be added to overcome the failsafe limitation, if desired.

According to all of the preferred embodiments of the invention, excellent ESD protection is provided by this invention for integrated circuits utilizing drain-extended MOS transistors. This protection is provided without requiring the masking or other elimination of isolation structures, such as shallow trench isolation structures, and are also compatible with other advanced technologies such as silicide-clad diffusions. In addition, the ESD protection structures according to this invention provide improved ESD protection performance over conventional structures, including higher failure current levels $I_{t2}$. The implementation of these inventive structures is compatible with failsafe requirements, and also may be used in connection with low impedance terminals such as power supply terminals.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:

1. A method of conducting current applied to a terminal of an integrated circuit by an electrostatic discharge event, comprising:

conducting the current to a drain of a pump transistor;

capacitively coupling the current from the drain of the pump transistor to a gate of the pump transistor, the gate overlapping a portion of a well within which the drain is disposed to define the capacitance, so that the pump transistor is turned on to conduct the current to a source of the pump transistor;

conducting the current from the source of the pump transistor to a region of a substrate of the integrated circuit within which a protection transistor is disposed, the protection transistor having a channel region of the same conductivity type as the substrate disposed between drain and source regions;

wherein the source, drain, and channel regions of the protection transistor correspond to the emitter, base, and collector of a parasitic bipolar transistor;

wherein the drain of the protection transistor is connected to the terminal, the source of the protection transistor is connected to a reference voltage node, and a gate of the protection transistor is connected to the gate of the pump transistor;

and wherein the step of conducting the current from the source of the pump transistor forward biases a junction between the channel and source regions of the protection transistor and causes bipolar conduction of current from the terminal to the reference voltage node.

2. The method of claim 1, further comprising:

capacitively coupling current from the terminal to the gates of the pump and protection transistors via a junction capacitor.

3. The method of claim 1, further comprising:

boosting the current conducted to the region of a substrate of the integrated circuit within which a protection transistor is disposed by conducting current from the terminal to an anode of a junction diode to turn on a parasitic bipolar transistor having an emitter corresponding to the anode of the junction diode, a collector corresponding to the substrate, and a base corresponding to a well within which the cathode of the junction diode is disposed.

* * * * *